United States Patent
Hall et al.

(10) Patent No.: US 8,044,726 B2
(45) Date of Patent: Oct. 25, 2011

(54) SYSTEMS AND METHODS FOR SELF TESTING A VOLTAGE CONTROLLED OSCILLATOR

(75) Inventors: Tracy Hall, Chandler, AZ (US); Troy Stockstad, Chandler, AZ (US); Jin Wook Kim, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 73 days.

(21) Appl. No.: 12/406,028

(22) Filed: Mar. 17, 2009

(65) Prior Publication Data

US 2010/0237954 A1   Sep. 23, 2010

(51) Int. Cl.
*H03L 7/12* (2006.01)
*G01R 23/00* (2006.01)

(52) U.S. Cl. ............... 331/44; 331/16; 331/179; 331/1 A

(58) Field of Classification Search .................... 331/44, 331/16, 179, 1 A; 327/156, 157, 159; 324/76.19, 324/76.12, 76.39, 76.49, 76.53, 76.66
See application file for complete search history.

(56) References Cited

U.S. PATENT DOCUMENTS

| | | | |
|---|---|---|---|
| 6,683,502 B1 | 1/2004 | Groen et al. | |
| 6,747,519 B2 * | 6/2004 | Jaehne et al. | 331/16 |
| 7,263,152 B2 | 8/2007 | Miller et al. | |
| 7,263,340 B2 * | 8/2007 | Uozumi et al. | 455/255 |
| 7,295,078 B2 | 11/2007 | Coppola et al. | |
| 7,602,253 B2 | 10/2009 | Kim et al. | |
| 7,675,370 B2 * | 3/2010 | Sun et al. | 331/44 |

FOREIGN PATENT DOCUMENTS

EP   1583221 A1   10/2005

OTHER PUBLICATIONS

International Search Report and Written Opinion—PCT/US2010/027701, International Search Authority—European Patent Office—May 25, 2010.

* cited by examiner

*Primary Examiner* — Ryan Johnson
(74) *Attorney, Agent, or Firm* — Jiayu Xu

(57) ABSTRACT

A method for self testing a multiband voltage controlled oscillator (VCO) is described. A first frequency band in a VCO is selected. An N value is selected for a frequency divider that produces a tuning voltage for the VCO that is between a low tuning voltage limit and a high tuning voltage limit for the VCO. The N value is adjusted in one direction until the tuning voltage reaches one of the tuning voltage limits. This N value at the tuning voltage is a first limit value. The frequency bands are switched from the first frequency band to a second frequency band that is adjacent to the first frequency band.

30 Claims, 11 Drawing Sheets

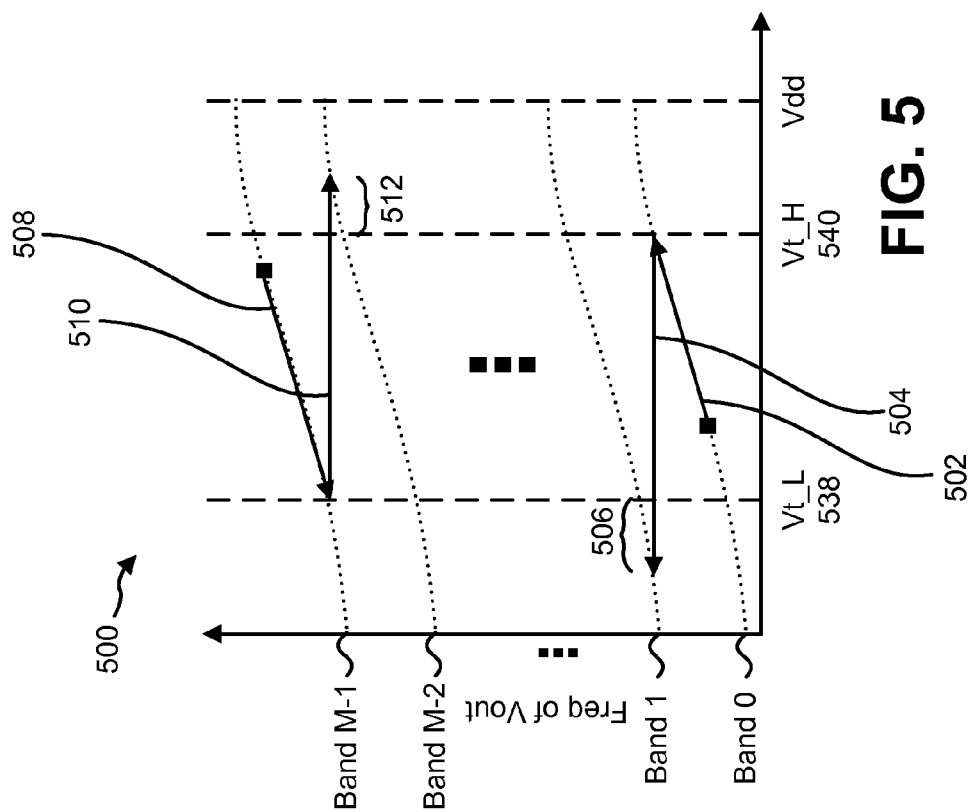
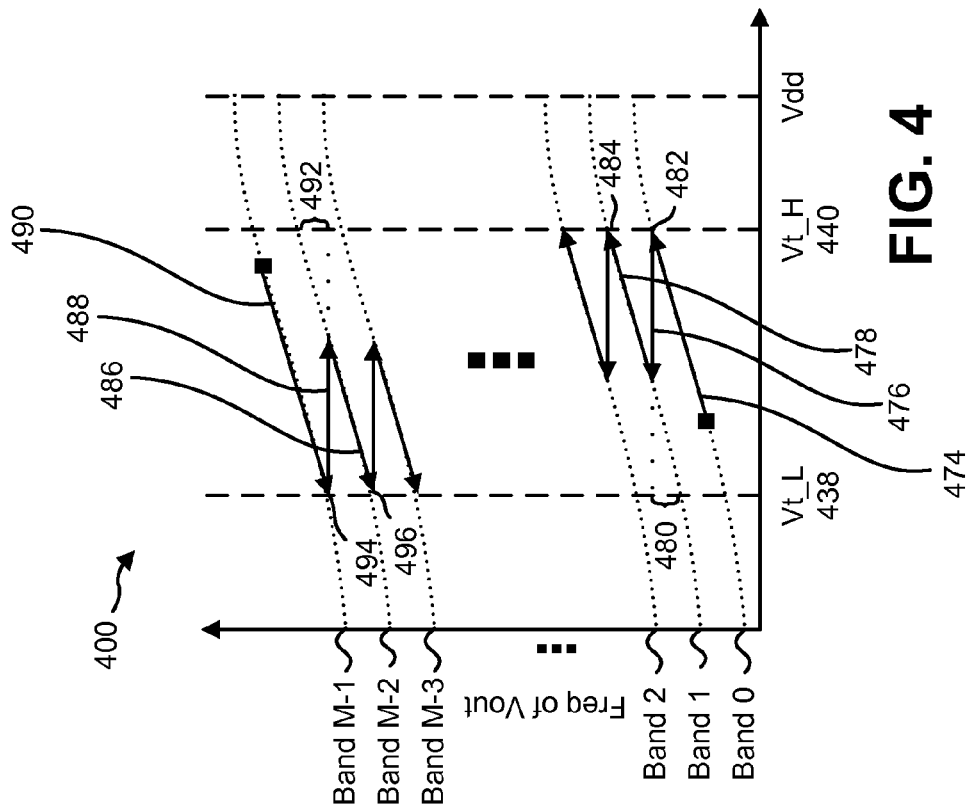

SYSTEMS AND METHODS FOR SELF TESTING A VOLTAGE CONTROLLED OSCILLATOR

TECHNICAL FIELD

The present disclosure relates generally to communication systems. More specifically, the present disclosure relates to self testing a multiband voltage controlled oscillator.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

This increased complexity has led to an increased need for testing that can test digital circuits and/or digital systems. As technology advances, it may be more and more important that particular circuits and/or digital systems are reliable. Therefore, the testing used to verify or test various parts of devices, such as pieces of hardware, and/or software are also increasing in importance.

In many cases the equipment used to test a device is a separate piece of equipment than the device being tested. In some testing configurations, test equipment may monitor one or more functions of the device while the device performs the function(s). Therefore, the device and the test equipment may be monopolized for the duration of the testing. Furthermore, the test equipment may be expensive to use. In contrast, a self test may be performed in some configurations with little or no involvement required from test equipment. Benefits may be realized, therefore, by providing improved methods and apparatus for providing built in self tests for electronic devices and/or components used in electronic devices.

BRIEF DESCRIPTION OF THE DRAWINGS

FIG. 4 is a plot showing the frequency of the output of a multiband VCO versus the tuning voltage input during a VCO built in self test;

FIG. 5 is another plot showing the frequency of the output of a multiband VCO versus the tuning voltage input during a VCO built in self test;

DETAILED DESCRIPTION

Figure 1:
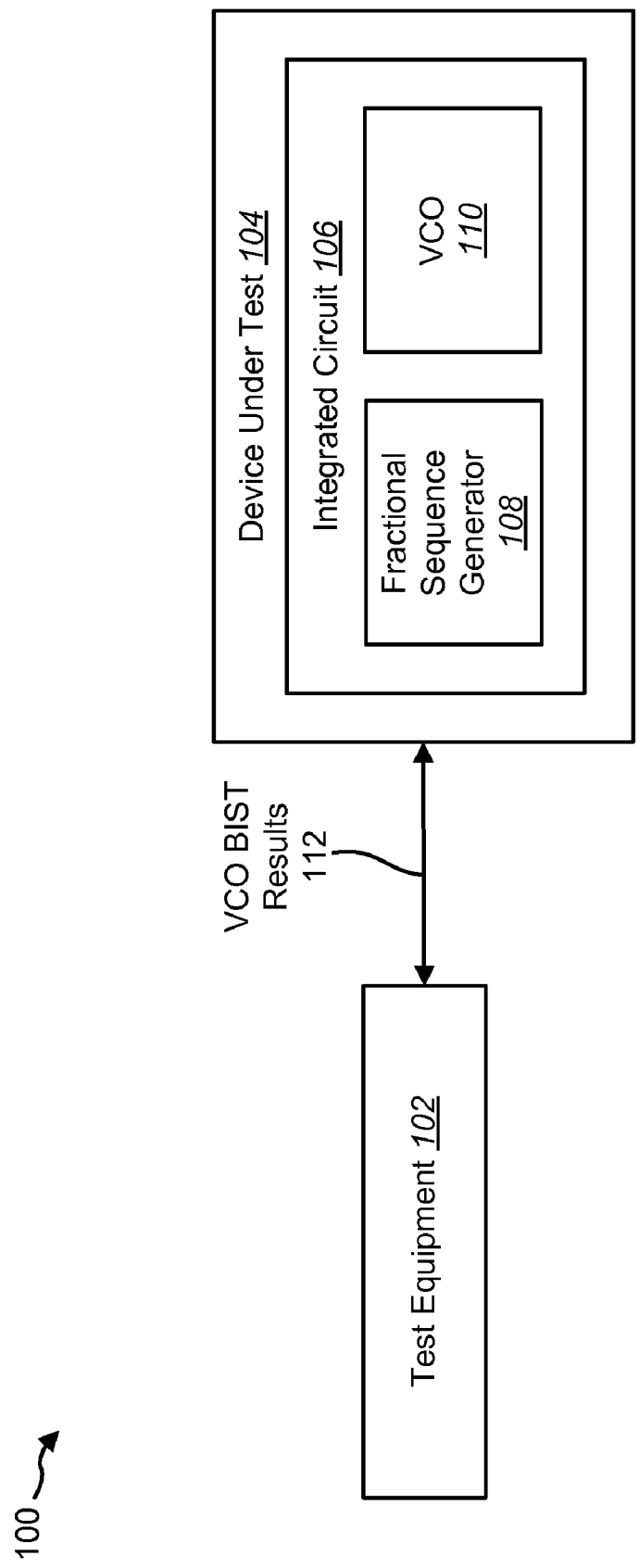
FIG. 1 is a block diagram illustrating a system for self testing a multiband voltage controlled oscillator (VCO)

A method for self testing a multiband voltage controlled oscillator (VCO) is disclosed. A first frequency band in a VCO is selected. An N value for a frequency divider is selected that produces a tuning voltage for the VCO that is between a low tuning voltage limit and a high tuning voltage limit for the VCO. The N value is adjusted in one direction until the tuning voltage reaches a first limit value corresponding to one of the tuning voltage limits. Frequency bands are switched from the first frequency band to a second frequency band that is adjacent to the first frequency band.

Results of the self test may be determined. The results may include an overlap between the first and second frequency bands. The N value adjustments and frequency band switches may be repeated one or more times or until all bands in the VCO have been switched to. Whether or not to store the results may be determined.

In one configuration, the N value may be adjusted, after switching, in the same direction until the tuning voltage reaches a second limit value corresponding to one of the tuning voltage limits. The determining may include subtracting the first limit value from the second limit value and multiplying by a reference frequency. A period of time may pass before the overlap between the first and second frequency bands is determined.

A wireless device configured to self test a multiband voltage controlled oscillator (VCO) is also disclosed. The wireless device includes a processor and memory in electronic communication with the processor. Executable instructions are stored in the memory. The instructions are executable to select a first frequency band in a VCO. The instructions are also executable to select an N value for a frequency divider that produces a tuning voltage for the VCO that is between a low tuning voltage limit and a high tuning voltage limit for the VCO. The instructions are also executable to adjust the N value in one direction until the tuning voltage reaches a first limit value corresponding to one of the tuning voltage limits. The instructions are also executable to switch frequency bands from the first frequency band to a second frequency band that is adjacent to the first frequency band.

A wireless device apparatus configured to self test a multiband voltage controlled oscillator (VCO) is also disclosed. The apparatus includes means for selecting a first frequency band in a VCO. The apparatus also includes means for selecting an N value for a frequency divider that produces a tuning voltage for the VCO that is between a low tuning voltage limit and a high tuning voltage limit for the VCO. The apparatus also includes means for adjusting the N value in one direction until the tuning voltage reaches a first limit value corresponding to one of the tuning voltage limits. The apparatus also includes means for switching frequency bands from the first frequency band to a second frequency band that is adjacent to the first frequency band.

A computer-program product for self testing a multiband voltage controlled oscillator (VCO) is also disclosed. The computer-program product comprises a computer-readable medium having instructions thereon. The instructions include code for selecting a first frequency band in a VCO. The instructions also include code for selecting an N value for a frequency divider that produces a tuning voltage for the VCO that is between a low tuning voltage limit and a high tuning voltage limit for the VCO. The instructions also include code for adjusting the N value in one direction until the tuning voltage reaches a first limit value corresponding to one of the tuning voltage limits. The instructions also include code for switching frequency bands from the first frequency band to a second frequency band that is adjacent to the first frequency band.

An integrated circuit for self testing a multiband voltage controlled oscillator (VCO) is also disclosed. The integrated circuit is configured to select a first frequency band in a VCO. The integrated circuit is also configured to select an N value for a frequency divider that produces a tuning voltage for the VCO that is between a low tuning voltage limit and a high tuning voltage limit for the VCO. The integrated circuit is also configured to adjust the N value in one direction until the tuning voltage reaches a first limit value corresponding to one of the tuning voltage limits. The integrated circuit is also configured to switch frequency bands from the first frequency band to a second frequency band that is adjacent to the first frequency band.

Multiband voltage controlled oscillators (VCO) are commonly used in integrated circuits in wireless devices. A VCO is a circuit where the frequency of the output is controlled by a voltage input. VCOs may be used in phase locked loops (PLLs) to generate stable signals at different frequencies. Since VCOs are required to output signals in a given frequency band, testing of multiband VCOs requires checking the overlap of the frequency bands to ensure continuous tunability. Overlap testing is one method of testing VCO tunability in which input voltage signals designed to produce various output frequencies are input for each band in the VCO. The overlap between the bands is then monitored to ensure the continuous tunability of the VCO. In other words, if there is no overlap between bands, i.e., a gap between bands, the VCO may be defective and dealt with accordingly. Because it may be very specialized, overlap testing may be performed offsite. Consequently, this type of testing may be very expensive. Additionally, multiband VCOs with a large number of bands, such as 128, 256 or more, may take a long time to test. This may further add to the expense.

There have been efforts to reduce the time and cost of overlap testing. In one design, switched varactors may be included in the VCOs to minimize the number of bands that would need to be tested. This may be done by forcing the minimum overlap to occur in a specific band. However, this may still require characterization time, test time, and ultimately the test is just a portion of the total overlap performance. Kvco characterization is sometimes "substituted" for overlap testing, however, Kvco is only a performance check while overlap is a functional check and is more definitive.

The present systems and methods describe a built-in self test (BIST) that may check for band overlap. This approach may reduce test time and may run in parallel with other processes. Specifically, the BIST may run in the background and store the results, which may then be viewed and analyzed, e.g., the BIST may store the smallest overlap(s) between bands, which may then indicate whether the VCO is capable of tuning to all required frequencies. Thus, a VCO BIST may eliminate the real-time monitoring using costly equipment previously necessary to thoroughly overlap test the VCO.

FIG. 1 is a block diagram illustrating a system 100 for self testing a multiband voltage controlled oscillator (VCO) 110. In one configuration, the device under test (DUT) 104 may be a wireless device such as a mobile station or a base station. Alternatively, the DUT 104 may be a chip for use in a wireless device. In other configurations, the DUT 104 may not be a wireless device or part of a wireless device. The DUT 104 may include an integrated circuit 106. The integrated circuit 106 may include mixed signal circuitry. Mixed signal circuitry may be circuitry that includes both analog and digital circuitry. In one configuration, the integrated circuit 106 may include a fractional sequence generator 108 that drives an n-divider to test a VCO 110 for continuous tunability. In other words, the fractional sequence generator 108 may select n-divider values that help determine whether the VCO 110 is capable of producing a signal at all the frequencies for which it is rated. In this way, the integrated circuit 106 may implement a Built In Self Test (BIST) to determine the tunability of the VCO 110. The fractional sequence generator 108 may include memory that includes data about the tuning range, frequency band overlap data, etc.

In one configuration, the system 100 may perform the BIST and store the VCO BIST results 112 and/or send the VCO BIST results 112 to the test equipment 102. As mentioned earlier, this may reduce or even eliminate the cost associated with the time-consuming and expensive real time monitoring often performed by automatic test equipment (ATE). Because the test equipment 102 may only be required to read the VCO BIST results 112 from the DUT 104, the test equipment 102 that is used may be simpler and cheaper than traditional ATE.

Figure 2:
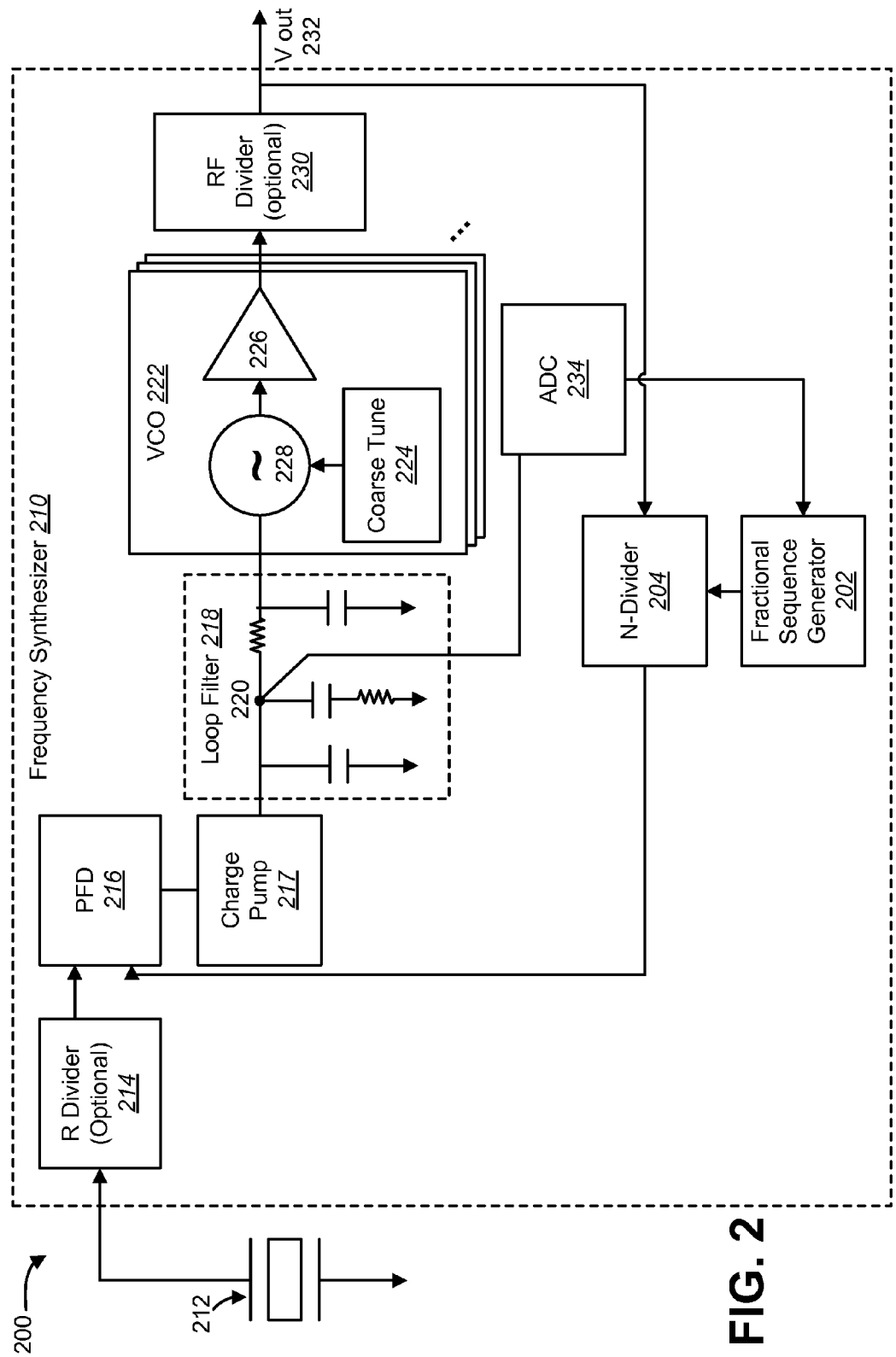
FIG. 2 is another block diagram illustrating a system for self testing a multiband VCO.

FIG. 2 is another block diagram illustrating a system 200 for self testing a multiband VCO 222. The system 200 may be implemented on a single integrated circuit and may include various modules in a feedback configuration. Specifically, the system 200 may include an n-divider 204 placed in the feedback loop of a phase locked loop (PLL) to implement a frequency synthesizer 210 that is capable of generating a range of frequencies from a single fixed reference signal 212, e.g., oscillator. Furthermore, the n-divider 204 may drive the tuning voltage for one or more VCO(s) 222 according to the output of a fractional sequence generator 202 in order to overlap test the VCO(s) 222. The n-divider 204 may be a frequency divider that divides the frequency of Vout 232.

In one configuration, a reference signal 212 with a predetermined frequency may be provided by a crystal oscillator and/or another suitable signal generator, from which the frequency synthesizer 210 may generate an output signal, Vout 232, that is fixed, i.e., locked, in frequency and/or phase to the reference signal 212. The frequency synthesizer 210 may also include a phase frequency detector (PFD) 216, a charge pump 217, a loop filter 218, and one or more VCOs 222 operating in a closed feedback loop. Optionally, the frequency synthesizer may also include an r-divider 214 that may alter the reference signal 212 prior to comparison at the PFD 216, e.g., divide the frequency of the reference signal 212.

In one configuration, the PFD 216 may compare the reference signal 212 to the output of the n-divider 204 in the feedback loop. The output of the n-divider 204 may be a signal with a frequency equal to the frequency of the output signal, Vout 232, divided by an integer parameter N. The parameter N may be chosen by the fractional sequence generator 202 to produce a desired Vtune value measured at node 220. The PFD 216 may determine any differences in phase and/or frequency between the output of the n-divider 204 and the reference signal 212 and express this difference as "pump up" or "pump down" pulses to the charge pump 217. The charge pump 217 may then provide charge to a loop filter 218 that may filter the charge pump 217 output to the tuning port of the VCO 222. For example, the PFD 216 may generate a digital output signal consisting of high and/or low pulses of varying lengths. The charge pump 217 may receive this signal and produce an output corresponding to the pump up and/or pump down signals from the PFD 216. The charge pump 217 output may subsequently be filtered by the loop filter 218 to provide a stable voltage level to the VCO(s) 222.

Upon receiving a signal from the charge pump 217 via the loop filter 218, the VCO(s) 222 may generate an output signal having a frequency based on the voltage level of the input signal provided by the loop filter 218. Signal generation at the VCO(s) 222 may be performed by an oscillator 228. Furthermore, rough adjustments to the oscillator 228 may be made using a coarse tuning module 224. The purpose of coarse tuning may be to lower the tuning sensitivity, Kvco, of the tuning port while still allowing the VCO 222 to cover a wide range of frequencies. Without coarse tuning, the Kvco of a VCO 222 may be required to be high to tune the VCO 222 across the entire range of interest. This may cause other detrimental effects in the performance of the system 200. The present systems and methods may switch in banks of capacitors to do a coarse adjustment to the desired frequency, and then the loop may perform fine adjustments via the tuning port. In other words, the coarse tuning module 224 may be responsible for switching frequency bands within the VCO 222. In this way, a VCO 222 may reuse a tuning range over and over again thus keeping the VCO 222 gain low.

In addition, an amplifier 226 may enable the VCO 222 to generate signals at a specified amplitude. The signals generated by the VCO 222 may optionally be reduced in frequency by an RF divider 230. Subsequently, Vout 232 may be fed back to the n-divider 204, where it may be divided again, and then to the PFD 216 to complete the feedback loop. In one configuration, signals generated by the VCO 222 may continually be compared to the reference signal 212 to facilitate continuous adjustment of Vout 232 in relation to the reference signal 212. In this way, Vout 232 may eventually lock to a frequency that is specified by the equation:

$$Vout\_freq=(Ref\_freq/R)*N \qquad (1)$$

where Vout_freq is the frequency of Vout 232, Ref_freq is the frequency of the reference signal 212, R is the parameter R used by the optional r-divider 214 to divide the frequency of the reference signal 212, and N is the parameter N used to by the n-divider 204 to divide the frequency of Vout 232. One example of a Ref_freq might be 80 MHz. For the purpose of illustration, assume there is no r-divider 214, i.e., R=1. Thus, the frequency of the output, Vout 232 may be described by:

$$Vout\_freq=Ref\_freq*N \qquad (2)$$

Thus, the output of the frequency synthesizer 210, Vout 232, may lock to the reference frequency 212 multiplied by N. Therefore, the fractional sequence generator 202 may be used to drive the n-divider 204 to produce values of N that result in tuning voltages for the VCO(s) 222 that test the continuous tunability of the VCO(s) 222. The tuning voltage for a VCO 222 may be measured at node 220 by an analog-to-digital converter (ADC) 234. This tuning voltage, Vtune, may be used by the fractional sequence generator 202 when determining a value for N.

Figure 3:
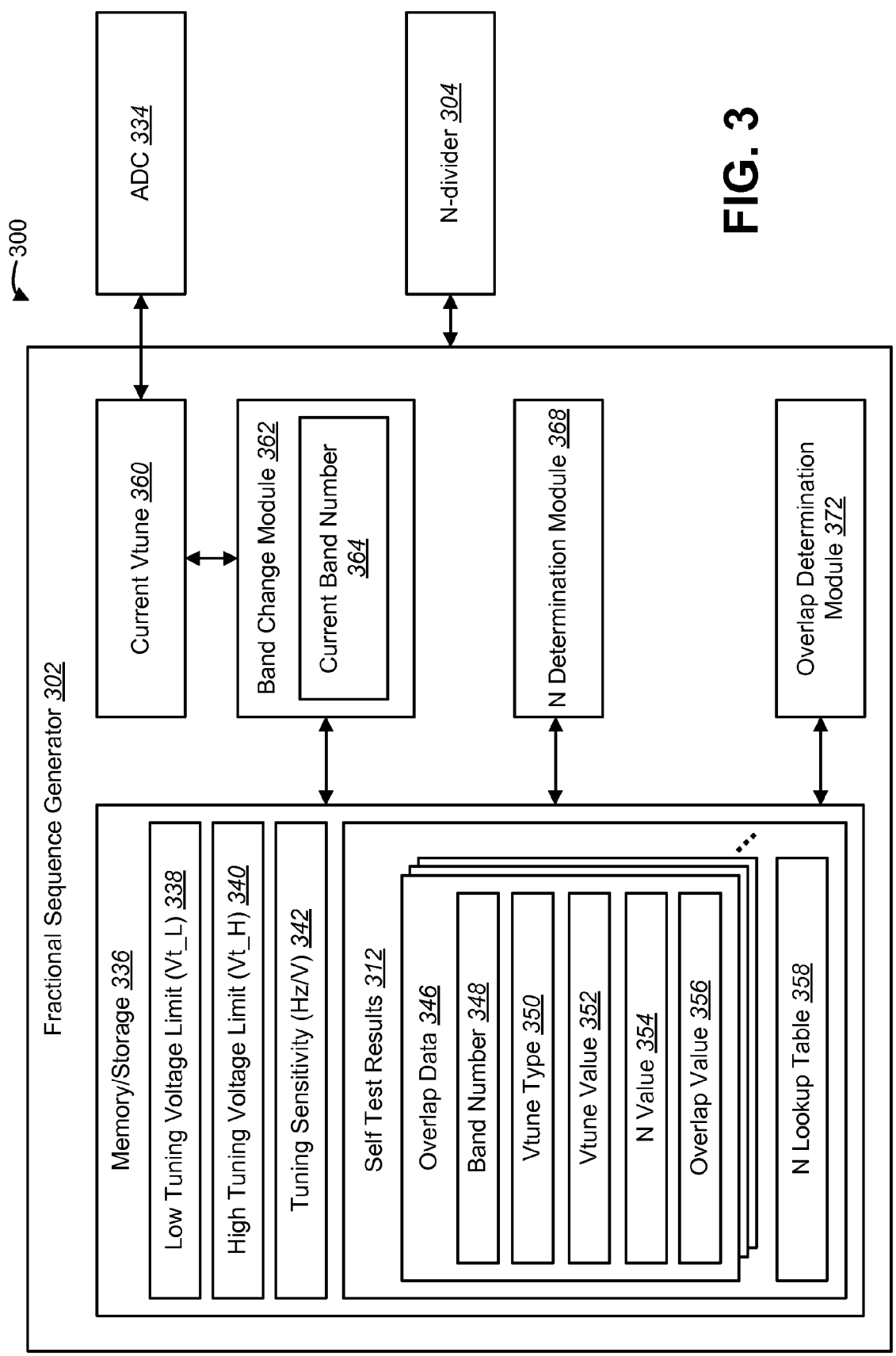
FIG. 3 is another block diagram illustrating a system for self testing a multiband VCO.

FIG. 3 is another block diagram illustrating a system 300 for self testing a multiband VCO 222. The system 300 may include a fractional sequence generator 302 that communicates with an ADC 334 and an n-divider 304. The system 300 may further be part of a frequency synthesizer 210. The fractional sequence generator 302 may include a memory or other suitable storage medium 336 that includes the low Vtune limit (Vt_L) 338 and the high Vtune limit (Vt_H) 340. Vt_L 338 and Vt_H 340 may be selected in light of charge pump 217 limitations. For example, and without limitation, Vt_L 338 for charge pump 217 operation may be 300-400 mV and Vt_H 340 may be 300-400 mV below the charge pump supply rail. The examples disclosed herein may be used with the present systems and methods, however, many configurations are possible, i.e., any suitable charge pump 217 operation range may be used. Additionally, the memory/storage 336 may include a tuning sensitivity parameter 342 measured in Hertz/Volt (Hz/V). This may be a parameter unique to a particular VCO 222 that estimates the slope of the frequency versus tuning voltage for the frequency band(s) within a VCO 222.

The memory/storage 336 may also include VCO BIST results 312 that include overlap data 346. In one configuration, the VCO BIST results 312 may include data on only a particular number of overlaps. For example, and without limitation, a VCO 222 may include many frequency bands, e.g., 128, 256, etc., but the VCO BIST results 312 may only store overlap data 346 for the frequency bands with the two smallest overlaps. The examples disclosed herein may be used with the present systems and methods, however, many configurations are possible, i.e., the VCO 222 may include any suitable number of bands and the VCO BIST results 312 may store any suitable number of overlaps. Alternatively, the VCO BIST results 312 may store overlap data 346 for any number of frequency bands, e.g., 4, 8, 16, etc. The overlap data 346 for a particular frequency band may include several parameters, e.g., frequency band number 348, Vtune type 350, Vtune value 352, N 354, and the overlap value 356. The N values 354 may be chosen by the fractional sequence generator 302 to step the tuning voltage value, Vtune 352, up or down through some or all of the frequency bands in a VCO 222 while monitoring the overlap values 356. The band number 348 may be the current band number 348 to which the overlap data 346 applies. The Vtune type 350 may indicate where on the frequency versus tuning voltage the Vtune value 352 falls, e.g., starting point for the VCO BIST, extreme voltage Vtune value 352 (Vt_H or Vt_L), Vtune value 352 following a band switch, etc. The Vtune value 352 may be the same as the current Vtune 360 when the overlap value 356 is measured and/or stored and may be measured by the ADC 334. Subsequently, the VCO BIST may proceed, and the current Vtune 360 may continue to be measured by the ADC 334. The ADC 334 may sample the current Vtune 360 following frequency locking.

The fractional sequence generator 302 may also include a band change module 362 that determines when the frequency band of the VCO 222 should be changed during the VCO BIST. This determination may include using information about the current Vtune 360 and Vt_L 338 or Vt_H 340. Additionally, this module 362 may store the current band number 364. In one configuration, the frequency band may be changed after the N value 354 has been changed such that Vtune≧Vt_H or Vtune≧Vt_L.

The fractional sequence generator 302 may also include an N determination module 368. This module 368 may use an N lookup table 358 to determine the change in the N value 354 based on the current Vtune 360 in relation to Vt_L 338 or Vt_H 340. Alternatively, the module 368 may calculate the desired change in N 354 based on the current Vtune 360 in relation to Vt_L 338 or Vt_H 340, the tuning sensitivity 342, and the reference frequency.

The fractional sequence generator 302 may also include an overlap determination module 372 that may calculate the overlap value 356 and may determine whether to store the overlap data 346 in the memory/storage 336. The overlap value 356 for a frequency band may be estimated using the N values 354 and the reference frequency, e.g., overlap=ΔN*Ref_freq, although many techniques may be used to calculate the overlap value 356.

FIG. 4 is a plot 400 showing the frequency of the output of a multiband VCO 222 versus the tuning voltage input during a VCO BIST. The plot 400 is shown for a VCO 222 with M frequency bands. The dotted curves represent the frequency response of Vout 232 in response to changes in Vtune 352. The solid arrows represent the actions taken in a VCO BIST. In the plot 400, a gap between bands may represent a frequency that cannot be achieved by the VCO 222. The plot 400 illustrates a VCO 222 that has no gaps, i.e., there is enough overlap between all bands. Therefore, a VCO 222 with bands as illustrated in the plot 400 may be capable of tuning to all frequencies within a range.

In one configuration, the Vtune value 352 and corresponding frequency of Vout 232 may be "marched" up through the frequency bands through proper selection of the N value 354. The VCO BIST may begin in a suitably low band. Here, band 0 is shown as the starting band, although the VCO BIST may begin on a different band. Starting in the lowest band, the frequency may be increased 474 through the band by increasing N value 354. The increased N value 354 may result in an increased Vtune value 352 until the Vt_H 440 is reached. The band may then be changed 476 to the next highest band, band 1 in this case, which may decrease the Vtune value 352 while keeping the same frequency of Vout 232. In other words, the horizontal line 476 in the plot 400 may represent the frequency band being changed from band 0 to band 1. The frequency may then again be increased 478 through the band by increasing the N value 354 until Vt_H 440 is reached. The difference in the N values 354 at the Vt_H 440 for each band may be proportional to the overlap between bands. In other words, the overlap between bands 0 and 1 in FIG. 4 shown by the range 480 may be estimated by the difference in N values 354 associated with frequencies for point 482 and point 484 multiplied by the reference frequency, i.e., (N2−N1)*Ref_freq. This value may then be stored as the measured overlap value 356.

In another configuration, the Vtune value 352 and corresponding frequency of Vout 232 may be "marched" down through the frequency bands through proper selection of the N value 354. Starting in the highest band (band M-1 in FIG. 4), the frequency may be decreased 490 through the band by decreasing the N value 354. The decreased N value 354 may result in a decreased Vtune value 352 until the Vt_L 438 is reached. The band may then be changed 488 to the next lowest band, band M-2 in this case, which may increase the Vtune value 352 while keeping the same frequency of Vout 232. In other words, the horizontal line 488 in the plot 500 may represent the frequency band being changed from band M-1 to band M-2. The frequency may then again be decreased 486 through the band by decreasing the N value 354 until Vt_L 438 is reached. The difference in the N values 354 at the Vt_L 438 for each band may be proportional to overlap between bands. In other words, the overlap between bands M-1 and M-2 in FIG. 4 shown by the range 492 may be estimated by the difference in N values 354 associated with frequencies for point 494 and point 496 multiplied by the reference frequency, i.e., (N2−N1)*Ref_freq. This value may then be stored as the measured overlap value 356.

FIG. 5 is another plot 500 showing the frequency of the output of a multiband VCO 222 versus the tuning voltage input during a VCO built in self test (BIST). The dotted curves represent the frequency response of Vout 232 in response to changes in Vtune 352. The solid arrows represent the actions taken in a VCO BIST. The plot 500 is shown for a VCO 222 with M frequency bands. The plot 500 illustrates a VCO 222 that has gaps, i.e., there is not enough overlap between all bands. Therefore, a VCO 222 with bands as illustrated in the plot 500 may not be capable of tuning to all frequencies within a range.

As before, the plot 500 illustrates "marching" up through the frequency bands through proper selection of the N value 354. Starting in the lowest band, the frequency may be increased 502 through the band by increasing N value 354, which increases the Vtune value 352 until the Vt_H 540 is reached. The band may then be changed 504 to the next highest band. The plot 400 of FIG. 4 had enough overlap between the frequency bands. This is indicated in FIG. 4 by the fact that the Vtune value 352 after frequency bands are changed 476 fell above Vt_L 438. The plot 500 of FIG. 5, however, illustrates a VCO 222 with inadequate overlap indicated by the Vtune value 352 that falls below Vt_L 538 after changing 504 frequency bands. The horizontal line 504 in the plot 500 may represent the frequency band being changed from band 0 to band 1. The overlap between bands 0 and 1 may be indicated by the Vtune value 352 relative to Vt_L 538 after the band change indicated by the range 506. Therefore, sufficient overlap between frequency bands, or lack thereof, may be indicated by the estimated overlap value 356, (N2−N1)*Ref_freq, as in FIG. 4 or by the Vtune value 352 after band change as in FIG. 5.

As before, the plot 500 also illustrates "marching" down through the frequency bands through proper selection of the N value 354. Starting in the highest band, M-1, the frequency may be decreased 508 through the band by decreasing N value 354, which decreases the Vtune value 352 until the Vt_L 538 is reached. The band may then be changed 510 to the next lowest band. The plot 400 of FIG. 4 had enough overlap between the frequency bands. This is indicated in FIG. 4 by the fact that the Vtune value 352 after frequency bands are changed 476 fell below Vt_H 440. The plot 500 of FIG. 5, however, illustrates a VCO 222 with inadequate overlap indicated by the Vtune value 352 that falls above Vt_H 540 after changing 510 frequency bands. The horizontal line 510 in the plot 500 may represent the frequency band being changed from band M-1 to band M. In other words, the overlap between bands M-1 and M-2 may be indicated by the Vtune value 352 relative to Vt_H 540 after the band change indicated by the range 512. Therefore, sufficient overlap between frequency bands, or lack thereof, may be indicated by the estimated overlap value 356, (N2−N1)*Ref_freq, as in FIG. 4 or by the Vtune value 352 after band change as in FIG. 5.

With reference to FIG. 4 and the overlap estimation technique described with FIG. 5, the overlap value 356 may be determined once the Vtune value 352 reaches the point Vt_H 440 or Vt_L 438 depending on whether the system 200 is marching up or down, respectively. The frequency band may then be changed 476 to the next higher band if marching up or changed 488 to the next lower band if marching down and the system 200 may wait for the loop to settle. The voltage difference between Vt_L 438 (if marching up) or Vt_H 440 (if marching down) and the Vtune value 352 after settling may be considered as overlap because the frequency range 480 may be covered between Band 0 and Band 1 and the frequency range 492 may be covered between Band M-1 and Band M-2.

Figure 6:
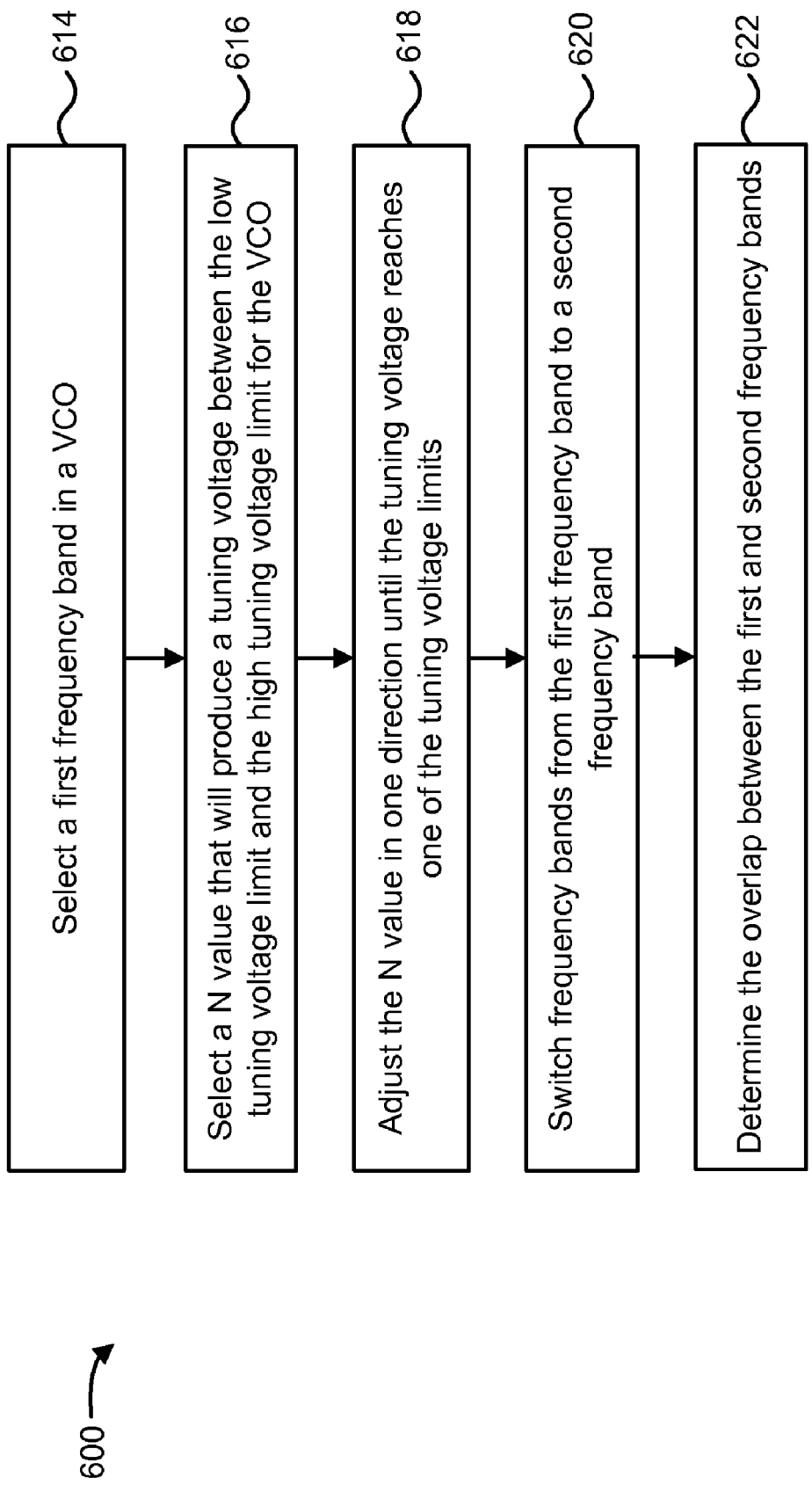
FIG. 6 is a flow diagram illustrating a method for self testing a multiband VCO.

FIG. 6 is a flow diagram illustrating a method 600 for self testing a multiband VCO 222. The method 600 may be performed by a fractional sequence generator 302. The fractional sequence generator 302 may select 614 a first frequency band in a multiband VCO 222. The starting band may be chosen by tuning the system 200 to the lowest frequency range it must support when "marching" up, or the highest frequency when "marching" down. A coarse tune algorithm may determine the first frequency band. For example, if the system 200 is designed to support frequencies from 4800 MHz to 5000 MHz, the system 200 may be tuned to 4800 MHz, the coarse tuner 224 may pick band 5, for example, and the VCO BIST may then check all the overlaps from band 5 to the final band, e.g., 127. In other words, the starting band may be chosen by running coarse tuning with a selected frequency. As another example, a lowest frequency of 2412 Hz may be chosen if marching up, or a highest frequency of 5825 Hz may be chosen if marching down.

The fractional sequence generator 302 may also select 616 an N value 354 that will produce a Vtune value 352 between the low tuning voltage limit, Vt_L 338, and the high tuning voltage limit, Vt_H 340, for the VCO 222. Vt_L 338 and Vt_H 340 may be chosen based on charge pump 217 limitations. For example, and without limitation, Vt_L 338 for charge pump 217 operation may be 300-400 mV and Vt_H 340 may be 300-400 mV below the charge pump 217 supply rail. The examples disclosed herein may be used with the present systems and methods, however, many configurations are possible, i.e., any suitable charge pump 217 operation range may be used. The fractional sequence generator 302 may also adjust 618 the N value 354 in one direction until Vtune 352 reaches one of the tuning voltage limits, Vt_L 338 and Vt_H 340. In other words, the N value 354 may be incremented until Vtune 352 reaches Vt_H 340 or the N value 354 may be decremented until Vtune 352 reaches Vt_L 338. At that point, the fractional sequence generator 302 may switch 620 frequency bands from the first frequency band to a second frequency band. In other words, if the VCO BIST is "marching" up, a higher band may be selected and if the VCO BIST is "marching" down, a lower band may be selected. The fractional sequence generator 302 may then determine 622 the overlap between the first and second frequency bands. This may include using the difference in N values, i.e., (N2−N1)*Ref_freq, as in FIG. 4 or the Vtune value 352 relative to a tuning voltage limit as in FIG. 5.

Figure 6A:
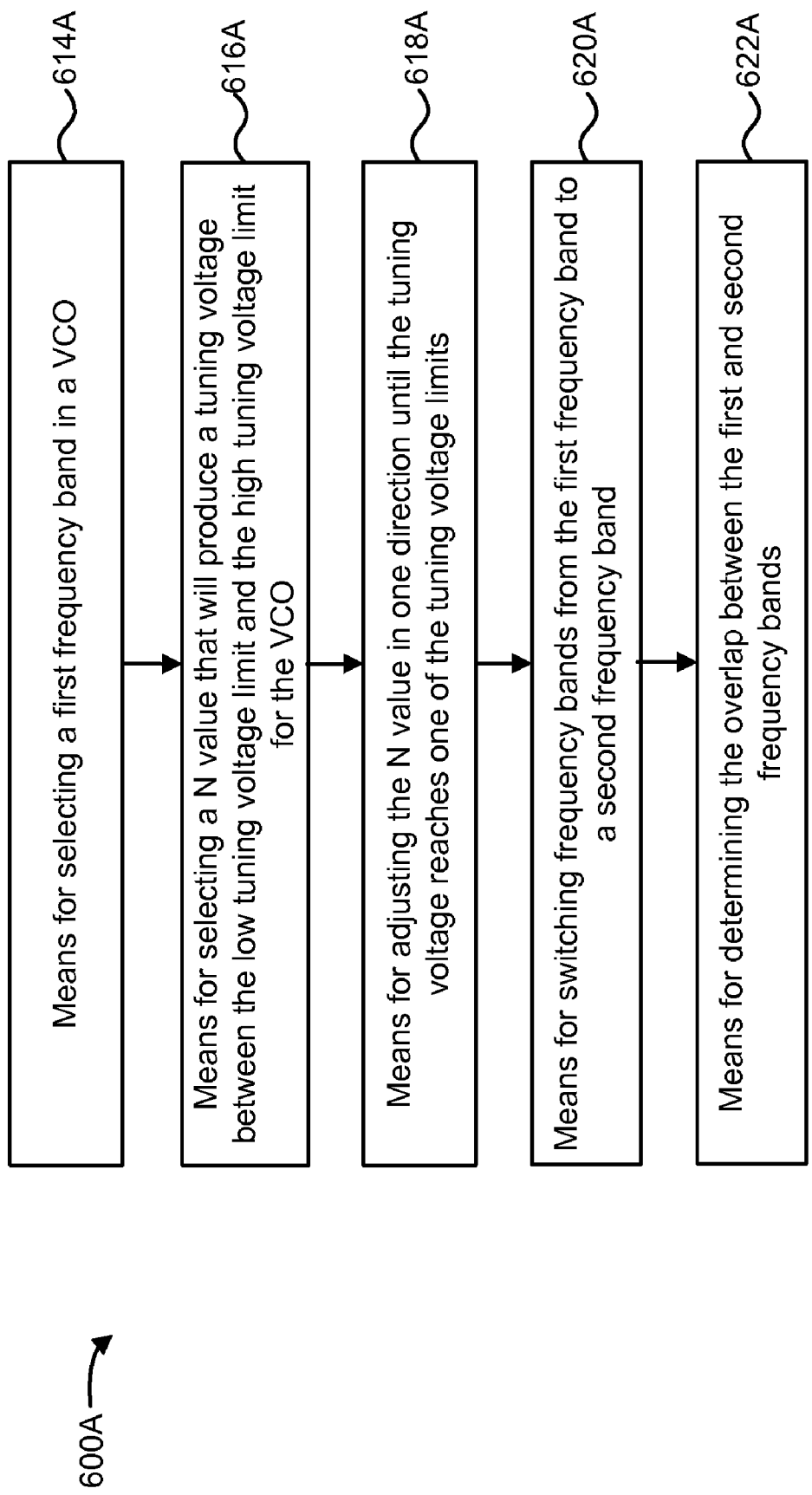
FIG. 6A illustrates means-plus-function blocks corresponding to the method of FIG. 6.

The method 600 of FIG. 6 described above may be performed by various hardware and/or software component(s) and/or module(s) corresponding to the means-plus-function blocks 600A illustrated in FIG. 6A. In other words, blocks 614 through 622 illustrated in FIG. 6 correspond to means-plus-function blocks 614A through 622A illustrated in FIG. 6A.

Figure 7:
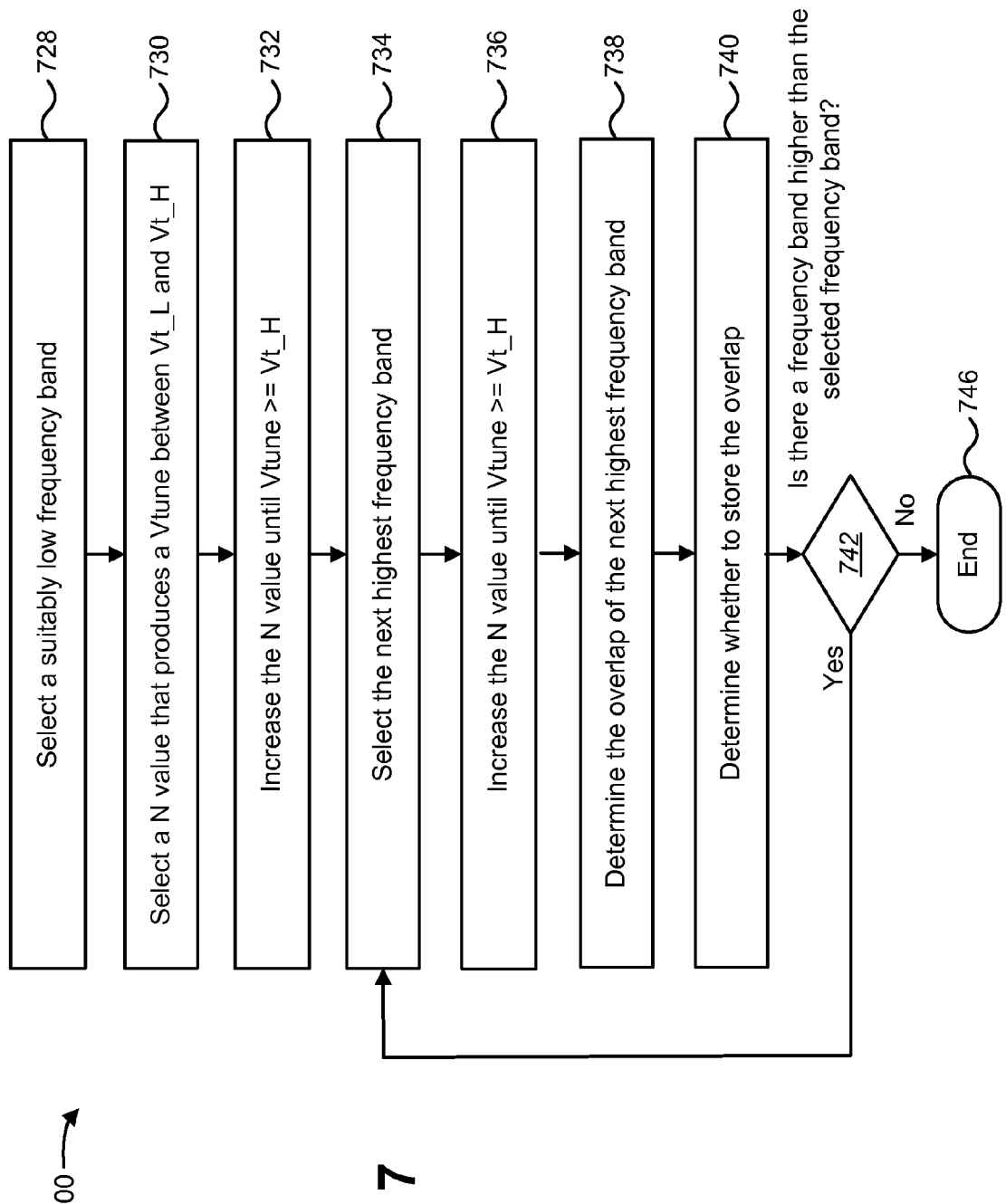
FIG. 7 is another flow diagram illustrating a method for self testing a multiband VCO.

FIG. 7 is another flow diagram illustrating a method 700 for self testing a multiband VCO 222. The method 700 may be performed by a fractional sequence generator 302. The fractional sequence generator 302 may select 728 a suitably low frequency band in a VCO 222. The fractional sequence generator 302 may also select 730 an N value 354 that produces a Vtune value 352 between Vt_L 338 and Vt_H 340. The fractional sequence generator 302 may also increase 732 the N value 354 until Vtune≧Vt_H. The fractional sequence generator 302 may select 734 the next highest frequency band. The fractional sequence generator 302 may again increase 736 the N value 354 until Vtune≧Vt_H. The fractional sequence generator 302 may determine 738 the overlap value 356 of the next highest frequency band. The fractional sequence generator 302 may determine 740 whether to store the overlap value 356. In one configuration, only the two smallest overlap values 356 may be stored. The fractional sequence generator 302 may determine 742 if there is a frequency band higher than the selected frequency band. If yes, the method 700 may return to step 734. If no, the method 700 may end 746. Note that in addition to illustrating "marching" up, the method 700 of FIG. 7 illustrates determining an overlap value 356 as discussed in the description of FIG. 4, i.e., overlap=(N2−N1)*Ref_freq.

Figure 7A:
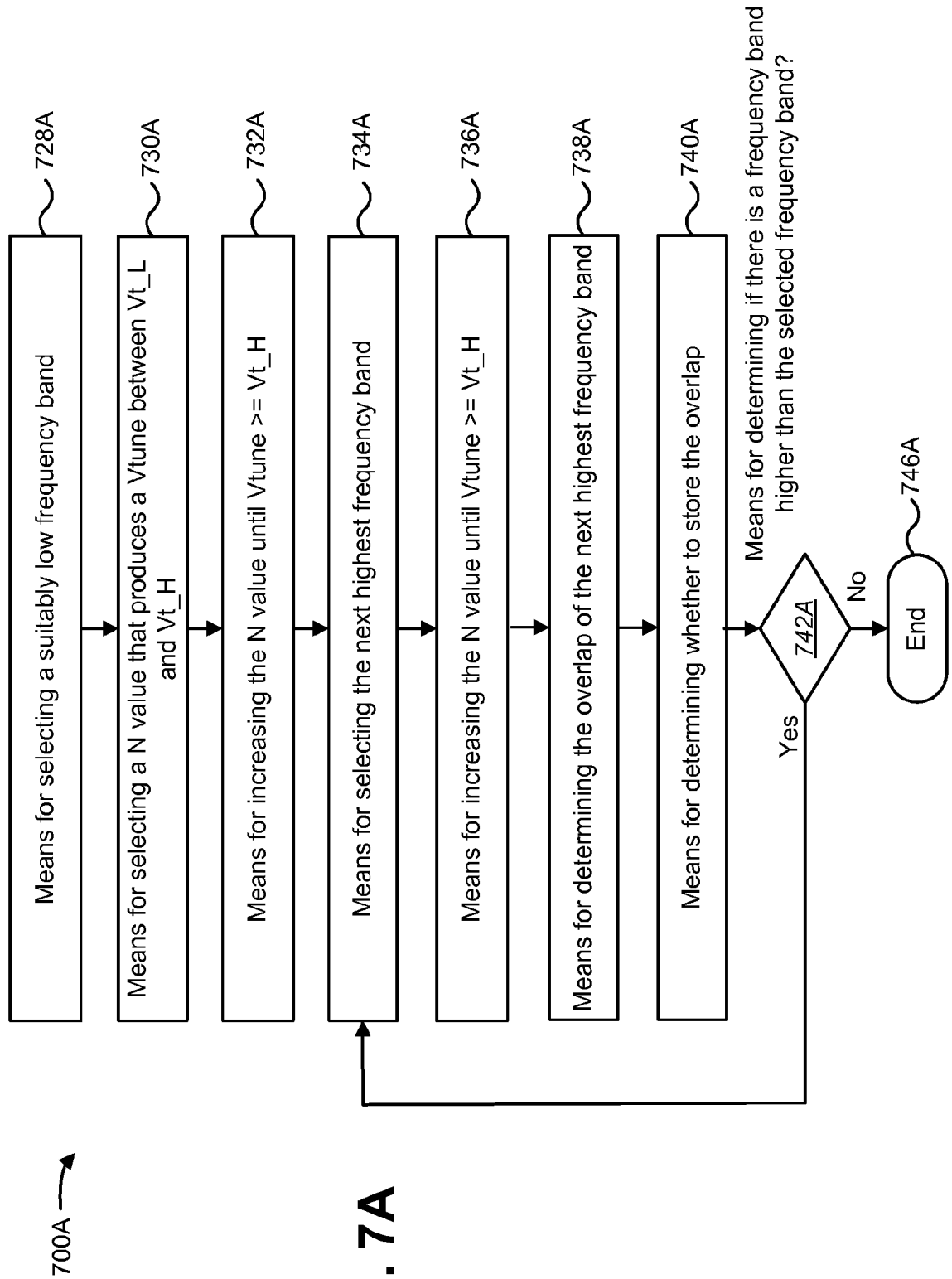
FIG. 7A illustrates means-plus-function blocks corresponding to the method of FIG. 7.

The method 700 of FIG. 7 described above may be performed by various hardware and/or software component(s) and/or module(s) corresponding to the means-plus-function blocks 700A illustrated in FIG. 7A. In other words, blocks 728 through 746 illustrated in FIG. 7 correspond to means-plus-function blocks 728A through 746A illustrated in FIG. 7A.

Figure 8:
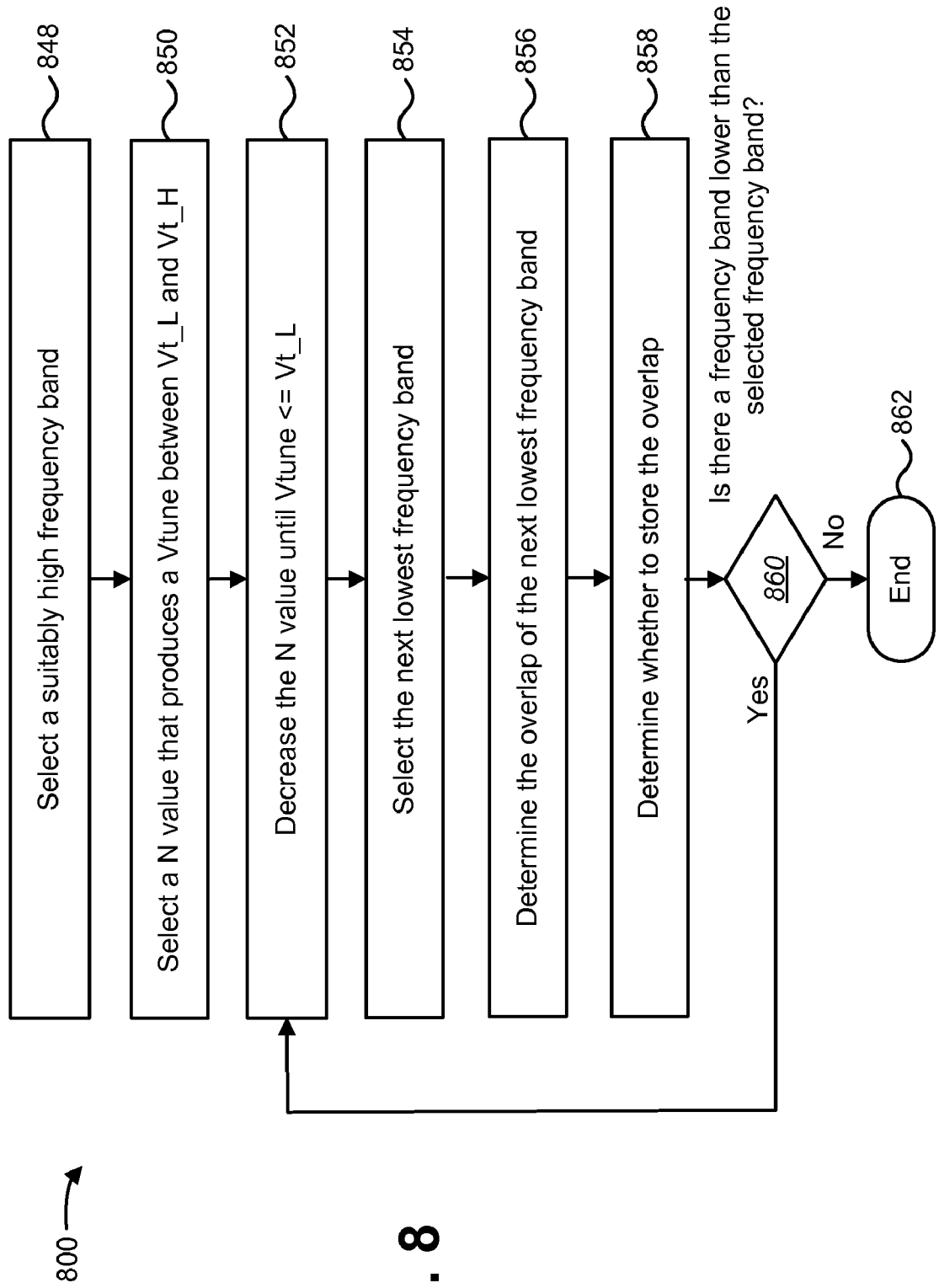
FIG. 8 is another flow diagram illustrating a method for self testing a multiband VCO.

FIG. 8 is another flow diagram illustrating a method 800 for self testing a multiband VCO 222. The method 800 may be performed by a fractional sequence generator 302. The fractional sequence generator 302 may select 848 a suitably high frequency band in a VCO 222. The fractional sequence generator 302 may also select 850 an N value 354 that produces a Vtune value 352 between Vt_L 338 and Vt_H 340. The fractional sequence generator 302 may decrease 852 the N value 354 until Vtune≧Vt_L. The fractional sequence generator 302 may select 854 the next lowest frequency band. The fractional sequence generator 302 may determine 856 the overlap value 356 of the next lowest frequency band. The fractional sequence generator 302 may determine 858 whether to store the overlap value 356. The fractional sequence generator 302 may determine 860 if there is a frequency band lower than the selected frequency band. If yes, the method 700 may return to step 852. If no, the method 800 may end 862. Note that in addition to illustrating "marching" down, the method 800 of FIG. 8 illustrates determining an overlap value 356 as discussed in the description of FIG. 5, i.e., comparing the Vtune value 352 to either Vt_L 338 and Vt_H 340 after changing frequency bands. Note also that the method 800 of FIG. 8 does not require more "marching" after changing bands before the overlap 356 may be determined 856.

Figure 8A:
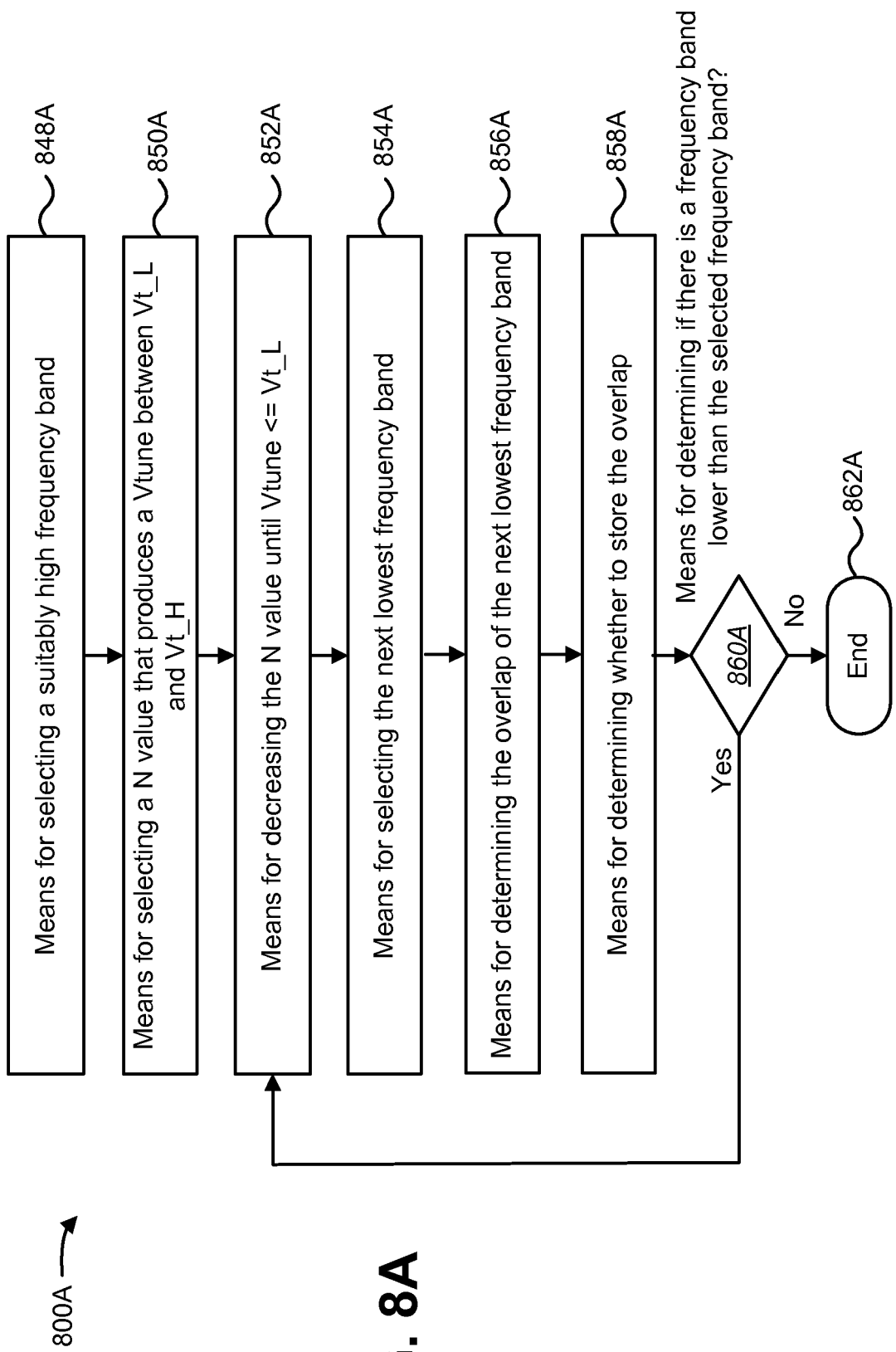
FIG. 8A illustrates means-plus-function blocks corresponding to the method of FIG. 8.

The method 800 of FIG. 8 described above may be performed by various hardware and/or software component(s) and/or module(s) corresponding to the means-plus-function blocks 800A illustrated in FIG. 8A. In other words, blocks 848 through 862 illustrated in FIG. 8 correspond to means-plus-function blocks 848A through 862A illustrated in FIG. 8A.

In one configuration, the present systems and methods may use a lookup table 358 when self testing a multiband VCO 222. The lookup table 358 may be implemented in the fractional sequence generator 302 in order to avoid having to make complicated calculations. Suitable wait times may be implemented by the lookup table 358 depending on the distance of Vtune 352 from Vt_L 338 and/or Vt_H 340. The lookup table 358 may also have various other values based on the distance of Vtune 352 from Vt_L 338 and/or Vt_H 340, e.g., |Vtune-Vt_L| or |Vtune-Vt_H|.

By way of example, assume a starting band 0 with a Vtune=0.75V. If Vt_H 340 is desired and Vt_H=1.0 V, the fractional sequence generator 302 may be required to calculate the N value 354 that will produce a change in Vtune 352 of 0.25 V (1−0.75=0.25). First, the fractional sequence generator 302 may determine that a change of 0.25 V in Vtune 354 would result in 10 MHz change in Vout 232 if the tuning sensitivity 342 were 80 MHz/V (0.25V/2*80 MHz/v=10 MHz). Then, based on equation 2, the fractional sequence generator 302 may use the relation that ΔVout_freq=Ref_freq*ΔN and ΔN=ΔVout_freq/Ref_freq. Thus, for an 80 MHz reference signal 212, the fractional sequence generator 302 may need to change the N value 354 by 0.125 (10 MHz/80 MHz=0.125).

These types of calculations may be burdensome on a frequency synthesizer 210 in which the present systems and methods may be implemented. Instead, the lookup table 358 may provide a simpler means of determining the required change in the N value 354 based on the Vtune value 352. Using the lookup table 358, the fractional sequence generator 302 may determine the value of |Vtune–Vt_H| if marching up and |Vtune–Vt_L| if marching down. The lookup table 358 may be indexed according to |Vtune–Vt_H| if marching up. If |Vtune–Vt_H| is greater than or equal to 0.25 V, the N value step entry may be 0.125. A wait time in the lookup table 358 may indicate the amount of time the fractional sequence generator 302 should wait before resampling Vtune 352 to give the circuit time to settle. The lookup table 358 may include multiple entries, e.g., N value steps and wait times for |Vtune–Vt_H| or |Vtune–Vt_L| values of 0.5 V, 0.25 V, 0.125V, 0.06V, 0.03 V, 0.015 V, 0.007 V, etc. In other words, the lookup table 358 may eliminate the need to perform complex calculations.

Figure 9:
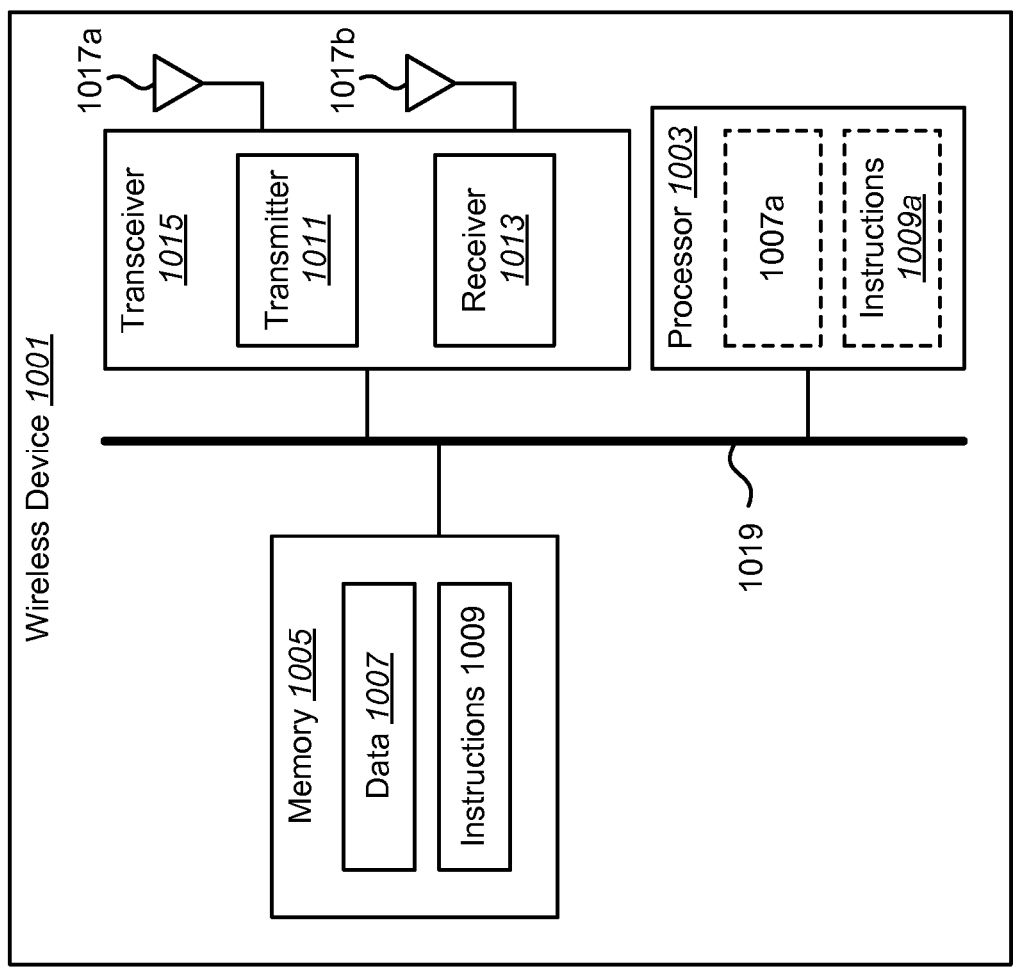
FIG. 9 illustrates certain components that may be included within a wireless device.

FIG. 9 illustrates certain components that may be included within a wireless device 1001. The wireless device 1001 may be a mobile device/station or a base station, i.e., an access point. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The present systems and methods may be used on an integrated circuit 106 that may be part of a wireless device 1001. Additionally, the present systems and methods may be used on an integrated circuit 106 that may be an electronic device that is not a wireless device 1001. However, the electronic device block diagram and components would be similar to the wireless device 1001 of FIG. 10 except that the electronic device may not have a transceiver 1015.

The wireless device 1001 may include a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the wireless device 1001 of FIG. 10, in an alternative configuration, a combination of processors (e.g., an ARM and DSP) could be used.

The wireless device 1001 also includes memory 1005. The memory 1005 may be any electronic component capable of storing electronic information. The memory 1005 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1007 and instructions 1009 may be stored in the memory 1005. The instructions 1009 may be executable by the processor 1003 to implement the methods disclosed herein. Executing the instructions 1009 may involve the use of the data 1007 that is stored in the memory 1005. When the processor 1003 executes the instructions 1009, various portions of the instructions 1009a may be loaded onto the processor 1003, and various pieces of data 1007a may be loaded onto the processor 1003.

The wireless device 1001 may also include a transmitter 1011 and a receiver 1013 to allow transmission and reception of signals to and from the wireless device 1001. The transmitter 1011 and receiver 1013 may be collectively referred to as a transceiver 1015. An antenna 1017 may be electrically coupled to the transceiver 1015. The wireless device 1001 may also include (not shown) multiple transmitters, multiple receivers, multiple transceivers and/or multiple antenna (e.g., 1017a, 1017b).

The various components of the wireless device 1001 may be coupled together by one or more buses, which may include a power bus, a control signal bus, a status signal bus, a data bus, etc. For the sake of clarity, the various buses are illustrated in FIG. 10 as a bus system 1019.

In the above description, reference numbers have sometimes been used in connection with various terms. Where a term is used in connection with a reference number, this is meant to refer to a specific element that is shown in one or more of the Figures. Where a term is used without a reference number, this is meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 6-8, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for self testing a multiband voltage controlled oscillator (VCO), comprising:
   selecting a first frequency band in a VCO;
   selecting an N value for a frequency divider that produces a tuning voltage for the VCO that is between a low tuning voltage limit and a high tuning voltage limit for the VCO;
   adjusting the N value in one direction until the tuning voltage reaches a first limit value corresponding to one of the tuning voltage limits;
   switching frequency bands from the first frequency band to a second frequency band that is adjacent to the first frequency band; and
   determining an overlap between the first and second frequency bands based on the switching.

2. The method of claim 1, further comprising repeating the adjusting and the switching one or more times.

3. The method of claim 1, further comprising repeating the adjusting and the switching until all bands in the VCO have been switched to.

4. The method of claim 1, further comprising determining whether to store the overlap between the first and second frequency bands.

5. The method of claim 1, further comprising adjusting the N value, after switching, in the same direction until the tuning voltage reaches a second limit value corresponding to one of the tuning voltage limits.

6. The method of claim 5, wherein the determining comprises subtracting the first limit value from the second limit value and multiplying by a reference frequency.

7. The method of claim 1, wherein the determining comprises comparing the tuning voltage to one of the tuning voltage limits after the switching.

8. The method of claim 1, wherein the adjusting comprises using a lookup table to determine how much to adjust the N value based on the difference between the tuning voltage and one of the tuning voltage limits.

9. The method of claim 1, further comprising waiting a period of time before determining the overlap between the first and second frequency bands.

10. A wireless device configured to self test a multiband voltage controlled oscillator (VCO), comprising:
    a processor;
    memory in electronic communication with the processor;
    instructions stored in the memory, the instructions being executable by the processor to:
      select a first frequency band in a VCO;
      select an N value for a frequency divider that produces a tuning voltage for the VCO that is between a low tuning voltage limit and a high tuning voltage limit for the VCO;
      adjust the N value in one direction until the tuning voltage reaches a first limit value corresponding to one of the tuning voltage limits;
      switch frequency bands from the first frequency band to a second frequency band that is adjacent to the first frequency band; and
      determine an overlap between the first and second frequency bands based on the switching.

11. The wireless device of claim 10, wherein the instructions are further executable to repeat the adjusting and the switching one or more times.

12. The wireless device of claim 10, wherein the instructions are further executable to repeat the adjusting and the switching until all bands in the VCO have been switched to.

13. The wireless device of claim 10, wherein the instructions are further executable to determine whether to store the overlap between the first and second frequency bands.

14. The wireless device of claim 10, wherein the instructions are further executable to adjust the N value, after switching, in the same direction until the tuning voltage reaches a second limit value corresponding to one of the tuning voltage limits.

15. The wireless device of claim 14, wherein the instructions executable to determine comprise instructions executable to subtract the first limit value from the second limit value and multiply by a reference frequency.

16. The wireless device of claim 10, wherein the instructions executable to determine comprise instructions executable to compare the tuning voltage to one of the tuning voltage limits after the switching.

17. The wireless device of claim 10, wherein the instructions executable to adjust comprise instructions executable to use a lookup table to determine how much to adjust the N value based on the difference between the tuning voltage and one of the tuning voltage limits.

18. The wireless device of claim 10, wherein the instructions are further executable to wait a period of time before determining the overlap between the first and second frequency bands.

19. A wireless device configured to self test a multiband voltage controlled oscillator (VCO), comprising:
   means for selecting a first frequency band in a VCO;
   means for selecting an N value for a frequency divider that produces a tuning voltage for the VCO that is between a low tuning voltage limit and a high tuning voltage limit for the VCO;
   means for adjusting the N value in one direction until the tuning voltage reaches a first limit value corresponding to one of the tuning voltage limits;
   means for switching frequency bands from the first frequency band to a second frequency band that is adjacent to the first frequency band; and
   means for determining an overlap between the first and second frequency bands based on the switching.

20. The wireless device of claim 19, further comprising means for adjusting the N value, after switching, in the same direction until the tuning voltage reaches a second limit value corresponding to one of the tuning voltage limits.

21. The wireless device of claim 20, wherein the means for determining comprises means for subtracting the first limit value from the second limit value and multiplying by a reference frequency.

22. The wireless device of claim 19, wherein the means for determining comprises means for comparing the tuning voltage to one of the tuning voltage limits after the switching.

23. A computer-program product for self testing a multiband voltage controlled oscillator (VCO), the computer-program product comprising a non-transitory computer-readable medium having instructions thereon, the instructions comprising:
   code for selecting a first frequency band in a VCO;
   code for selecting an N value for a frequency divider that produces a tuning voltage for the VCO that is between a low tuning voltage limit and a high tuning voltage limit for the VCO;
   code for adjusting the N value in one direction until the tuning voltage reaches a first limit value corresponding to one of the tuning voltage limits;
   code for switching frequency bands from the first frequency band to a second frequency band that is adjacent to the first frequency band; and
   code for determining an overlap between the first and second frequency bands based on the switching.

24. The computer-program product of claim 23, further comprising code for adjusting the N value, after switching, in the same direction until the tuning voltage reaches a second limit value corresponding to one of the tuning voltage limits.

25. The computer-program product of claim 24, wherein the code for determining comprises code for subtracting the first limit value from the second limit value and multiplying by a reference frequency.

26. The computer-program product of claim 23, wherein the code for determining comprises code for comparing the tuning voltage to one of the tuning voltage limits after the switching.

27. An integrated circuit for self testing a multiband voltage controlled oscillator (VCO), the integrated circuit being configured to:
   select a first frequency band in a VCO;
   select an N value for a frequency divider that produces a tuning voltage for the VCO that is between a low tuning voltage limit and a high tuning voltage limit for the VCO;
   adjust the N value in one direction until the tuning voltage reaches a first limit value corresponding to one of the tuning voltage limits;
   switch frequency bands from the first frequency band to a second frequency band that is adjacent to the first frequency band; and
   determine an overlap between the first and second frequency bands based on the switching.

28. The integrated circuit of claim 27, wherein the integrated circuit is further configured to adjust the N value, after switching, in the same direction until the tuning voltage reaches a second limit value corresponding to one of the tuning voltage limits.

29. The integrated circuit of claim 28, wherein the determining comprises subtracting the first limit value from the second limit value and multiplying by a reference frequency.

30. The integrated circuit of claim 27, wherein the determining comprises comparing the tuning voltage to one of the tuning voltage limits after the switching.

* * * * *